(12) United States Patent
Chuang et al.

(10) Patent No.: US 9,985,075 B2
(45) Date of Patent: May 29, 2018

(54) DUMMY BOTTOM ELECTRODE IN INTERCONNECT TO REDUCE CMP DISHING

(71) Applicant: Taiwan Semiconductor Manufacturing Co., Ltd., Hsin-Chu (TW)

(72) Inventors: Harry-Hak-Lay Chuang, Zhubei (TW); Wen-Chun You, Dongshan Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 23 days.

(21) Appl. No.: 15/345,928

(22) Filed: Nov. 8, 2016

(65) Prior Publication Data
US 2017/0053967 A1    Feb. 23, 2017

Related U.S. Application Data

(63) Continuation of application No. 14/810,763, filed on Jul. 28, 2015, now Pat. No. 9,502,466.

(51) Int. Cl.
| | |
|---|---|
| *H01L 27/00* | (2006.01) |
| *H01L 27/24* | (2006.01) |
| *H01L 27/22* | (2006.01) |
| *H01L 43/08* | (2006.01) |
| *H01L 43/12* | (2006.01) |
| *H01L 23/522* | (2006.01) |
| *H01L 23/528* | (2006.01) |

(Continued)

(52) U.S. Cl.
CPC ........ *H01L 27/2436* (2013.01); *H01L 23/528* (2013.01); *H01L 23/5226* (2013.01); *H01L 23/5329* (2013.01); *H01L 27/222* (2013.01); *H01L 27/228* (2013.01); *H01L 43/02* (2013.01); *H01L 43/08* (2013.01); *H01L 43/12* (2013.01); *H01L 45/1233* (2013.01); *H01L 45/1253* (2013.01); *H01L 45/146* (2013.01); *H01L 45/1608* (2013.01)

(58) Field of Classification Search
None
See application file for complete search history.

(56) References Cited

U.S. PATENT DOCUMENTS

| | | |
|---|---|---|
| 5,895,947 A | 4/1999 | Lee et al. |
| 6,074,908 A | 6/2000 | Huang |

(Continued)

OTHER PUBLICATIONS

Notice of Allowance dated Jul. 20, 2016 in connection with U.S. Appl. No. 14/810,763.

*Primary Examiner* — Evren Seven
(74) *Attorney, Agent, or Firm* — Eschweiler & Potashnik, LLC

(57) ABSTRACT

The present disclosure relates an integrated circuit (IC). A plurality of metal layers is disposed within an inter-layer dielectric (ILD) material over the substrate. A memory cell is disposed over a first metal layer at a memory region and comprising a bottom electrode directly above a first metal line within the first metal layer and a top electrode separated from the bottom electrode by a resistance switching element. A dummy structure comprises a dummy bottom electrode arranged directly above a second metal line within the first metal layer at a logic region adjacent to the memory region.

20 Claims, 7 Drawing Sheets

(51) Int. Cl.
*H01L 23/532* (2006.01)
*H01L 43/02* (2006.01)
*H01L 45/00* (2006.01)

(56) References Cited

U.S. PATENT DOCUMENTS

| | | | |
|---|---|---|---|
| 6,358,755 | B1 | 3/2002 | Evans |
| 8,222,683 | B2 * | 7/2012 | Horii ................. H01L 27/11502 |
| | | | 257/296 |
| 8,395,196 | B2 | 3/2013 | Czabaj et al. |
| 8,759,891 | B2 | 6/2014 | Tanaka et al. |
| 8,916,434 | B2 | 12/2014 | Sun et al. |
| 2003/0015743 | A1 | 1/2003 | Ogawa et al. |
| 2007/0102731 | A1 | 5/2007 | Sakagami |
| 2011/0049611 | A1 | 3/2011 | Kiyotoshi et al. |
| 2011/0233505 | A1 | 9/2011 | Nitta |
| 2012/0091559 | A1 | 4/2012 | Tu et al. |
| 2013/0020623 | A1 | 1/2013 | Tsui et al. |
| 2013/0200475 | A1 | 8/2013 | Chiang et al. |
| 2013/0237028 | A1 | 9/2013 | Furuhashi |
| 2013/0241009 | A1 | 9/2013 | Fujimoto |
| 2014/0166961 | A1 | 6/2014 | Liao et al. |
| 2015/0129878 | A1 | 5/2015 | Shin et al. |
| 2015/0145022 | A1 | 5/2015 | Chuang et al. |
| 2015/0221651 | A1 * | 8/2015 | Toh ................... H01L 27/10802 |
| | | | 257/192 |
| 2015/0221652 | A1 | 8/2015 | Toh et al. |
| 2015/0270482 | A1 | 9/2015 | Lee |
| 2015/0333068 | A1 | 11/2015 | Toh et al. |
| 2016/0005756 | A1 | 1/2016 | Chuang et al. |
| 2016/0013198 | A1 | 1/2016 | Liu |
| 2016/0049416 | A1 | 2/2016 | Hosaka et al. |
| 2016/0056232 | A1 * | 2/2016 | Kuo ................... H01L 29/0649 |
| | | | 257/401 |
| 2016/0093801 | A1 | 3/2016 | Nishihara |
| 2016/0141298 | A1 | 5/2016 | Chuang et al. |
| 2016/0181143 | A1 | 6/2016 | Kwon et al. |
| 2016/0181268 | A1 | 6/2016 | Chuang et al. |

* cited by examiner

DUMMY BOTTOM ELECTRODE IN INTERCONNECT TO REDUCE CMP DISHING

CROSS REFERENCE TO RELATED APPLICATION

This application is a Continuation of U.S. patent application Ser. No. 14/810,763 filed on Jul. 28, 2015 in the name of Harry-Hak-Lay Chuang, et al., which is entitled "Dummy Bottom Electrode in Interconnect to Reduce CMP Dishing" and is hereby incorporated in its entirety.

BACKGROUND

Many modern electronic devices contain electronic memory configured to store data. Electronic memory may be volatile memory or non-volatile memory. Non-volatile memory is able to store data in the absence of power, whereas volatile memory is not. Magnetoresistive random-access memory (MRAM) and resistive random access memory (RRAM) are promising candidates for next generation non-volatile memory technology due to relative simple structures and their compatibility with complementary metal-oxide-semiconductor (CMOS) logic fabrication processes. As the size of on-chip components is scaled (i.e., reduced), device "shrinkage" allows engineers to integrate more components and more corresponding functionality onto newer generations of ICs. In recent technology nodes, this has allowed for non-volatile memory to be integrated on an integrated chip with logic devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
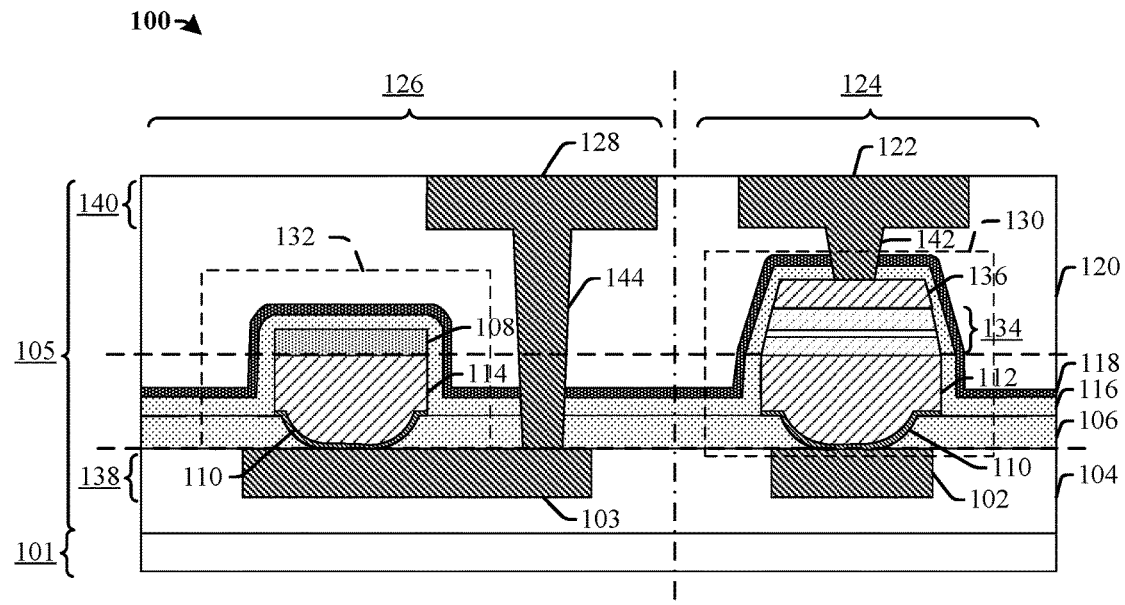
FIG. 1 illustrates a cross-sectional view of some embodiments of an integrated circuit (IC) having a memory region and an adjacent logic region.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A trend in semiconductor manufacturing is to integrate different types of devices on a single substrate to achieve higher integration. One example is a substrate having a logic region, in which logic devices are formed, and a memory region, in which magnetic random access memory (MRAM) or resistive random access memory (RRAM) devices are formed. To form these memory cells, which are formed in an interconnect structure overlying the substrate, a bottom electrode layer can be formed in the interconnect structure and over the memory region, and chemical mechanical polishing (CMP) can be used to planarize the bottom electrode layer. In such manufacturing processes, however, chemical mechanical polishing (CMP) may not result in a planar surface over the entire substrate. For example, when the bottom electrode layer (which has a relatively high structural integrity and tends to "resist" CMP relatively well) is present over the memory region but does not extend over the logic region, a metal interconnect line (which has a relatively low structural integrity compared to the bottom electrode layer) may be exposed to CMP in the logic region. Because this metal interconnect line is structurally "weaker" than the bottom electrode, performing CMP on the bottom electrode layer can cause "dishing" of the metal interconnect lines in the logic region. Therefore, after bottom electrode planarization for the memory devices, portions of the metal interconnect lines in the logic region can end up being thinner than in the memory region, possibly even being removed. Consequently, these eroded metal lines can degrade the reliability of the resultant IC.

Accordingly, the present disclosure relates to integrated circuit (IC) techniques to protect metal lines in such logic regions. Approaches include adding dummy structures directly above metal lines in the logic region to act as a CMP stop, thereby preventing CMP dishing of the metal lines when a bottom electrode of a memory cell is planarized. A dummy structure can comprise a dummy bottom electrode which corresponds in many regards to a bottom electrode of the memory cell but which is disposed over the logic region rather than over the memory region. The dummy bottom electrode is configured to protect underlying lower metal lines in the logic region from dishing during planarization of the bottom electrode layer, and thus results in more uniform metal lines over the IC.

FIG. 1 shows a cross-sectional view of an integrated circuit (IC) 100 disposed over a substrate 101 according to some embodiments.

As shown in FIG. 1, the IC 100 includes substrate 101 and an interconnect structure 105 over the substrate 101, which are split between a memory region 124 and an adjacent logic region 126. The memory region 124 can correspond to an array of memory cells (e.g., memory cell 130), which are disposed in the interconnect structure 105, while the logic region 126 can couple logic devices, such as transistors formed in the substrate 101, to support operation of the memory cells.

In some embodiments, the interconnect structure 105 comprises a lower interconnect layer 138 disposed within a lower inter-layer dielectric (ILD) layer 104 and an upper interconnect layer 140 disposed within an upper ILD layer 120. The lower interconnect layer 138 comprises a plurality of lower metal lines having co-planar upper surfaces, such as a first lower metal line 102 at the memory region 124 and a second lower metal line 103 at the logic region 126 and.

The memory cell 130 comprises a top electrode 136 and a bottom electrode 112, which are disposed between the lower interconnect layer 138 and the upper interconnect layer 140. The top and bottom electrodes 136, 112 are separated by a resistance switching element 134, such as a magnetic tunnel junction (MTJ). The bottom electrode 112 is arranged directly above the first lower metal line 102, and is electrically coupled to the first lower metal line 102 by a narrow, lower portion of the bottom electrode.

A dummy structure 132 is arranged directly above the second lower metal line 103 at the logic region 126. During manufacturing, the dummy structure 132 acts as a CMP stop over the logic region 126. Thus, for example, if the dummy structure 132 were not in place, when a CMP operation was carried out to planarize top surface of bottom electrode 112, the CMP operation could cause "dishing" in the logic region 126 and undesirably thin or remove second lower metal line 103. Thus, the dummy structure 132 provides sufficient structural rigidity to resist CMP during processing to protect the second lower metal line 103 from being eroded away during manufacturing.

The illustrated dummy structure comprises a dummy bottom electrode 114 and a dielectric mask 108 on the dummy bottom electrode 114. In some embodiments where CMP operations on the bottom electrode 112 can be otherwise problematic, the dummy bottom electrode is formed concurrently with the bottom electrode 112 and protects against dishing of second lower metal line 103 due to CMP operations on the bottom electrode 112. In some embodiments, the dielectric mask 108 may comprise silicon carbide (SiC) and may have a thickness of from about 20 Å to about 200 Å.

In some embodiments, a top etch stop layer 116 can extend upwardly along sidewalls of the dummy structure 132, along sidewalls of the memory cell 130, and overlie upper surfaces of the dummy structure 132 and the memory cell 130. The top etch stop layer 116 can also extend over a bottom etch stop layer 106, and the top and bottom etch stop layer 116, 106 can be made of the same or different dielectric materials. For example, the top etch stop layer 116 and the bottom etch stop layer 106 can comprise SiC in some embodiments. In some embodiments, a protective liner 118 is disposed directly along upper surfaces of the top etch stop layer 116. The protective liner 118 may comprise TEOS (Tetraethyl Orthosilicate) material.

In some embodiments, a top electrode via (TEVA) 142 connects a first upper metal line 122 of the upper interconnect layer 140 and the top electrode 136 of the memory cell 130. The TEVA 142 is disposed within the upper ILD layer 120 through a hole of the top etch stop layer 116 and the protective liner 118 and reach the top electrode 136. The top etch stop layer 116 and/or the protective liner 118 continuously covers an upper surface of the dummy structure 132, isolating the dummy structure 132 from the upper ILD layer 120 and the upper interconnect layer 140. In some embodiments, a through via 144 connects the second lower metal line 103 to a second upper metal line 128, or other logic devices.

In some embodiments, the bottom electrode 112 and the dummy bottom electrode 114 are made of the same material, for example, titanium nitride (TiN). An upper surface of the dummy bottom electrode 114 of the dummy structure 132 is co-planar with that of the bottom electrode 112 of the memory cell 130. A thickness of the dummy bottom electrode 114 and the bottom electrode 112 can be the same, and can be about 130 Å in some embodiments. Widths of the dummy bottom electrode 114 and the bottom electrode 112 can be the same or similar in some embodiments, for example, in a range of from about 200 Å to about 300 Å. In some embodiments, a height of the dummy structure 132 (from a bottom surface of the dummy bottom electrode 114 to a top surface of the dummy structure 132) can be about 300 Å smaller than a height of the memory cell (from a bottom surface to the bottom electrode 112 to a top surface of the top electrode 136). In some embodiments, the dummy bottom electrode 114 and the bottom electrode 112 can be respectively coupled to the underlying second lower metal line 103 and first lower metal line 102 through a barrier layer 110. In some embodiments, the barrier layer 110 comprises tantalum nitride (TaN) and may have a thickness of about 10 Å. In some other embodiments, the barrier layer 110 comprises tantalum (Ta) and may have a thickness of about 70 Å. In some other embodiments, the barrier layer 110 may comprise a conductive oxide, nitride, or oxynitride of a selected metal. In some embodiments, the dummy bottom electrode 114 and the bottom electrode 112 can comprise a lower portion, which acts as a bottom electrode via (BEVA) and which is narrower than an upper portion of the bottom electrode 112. The lower portion can have tilted sidewalls which are angled in a range of about 30° to about 60°, while the upper portion can have vertical or tilted sidewalls.

Figure 2:
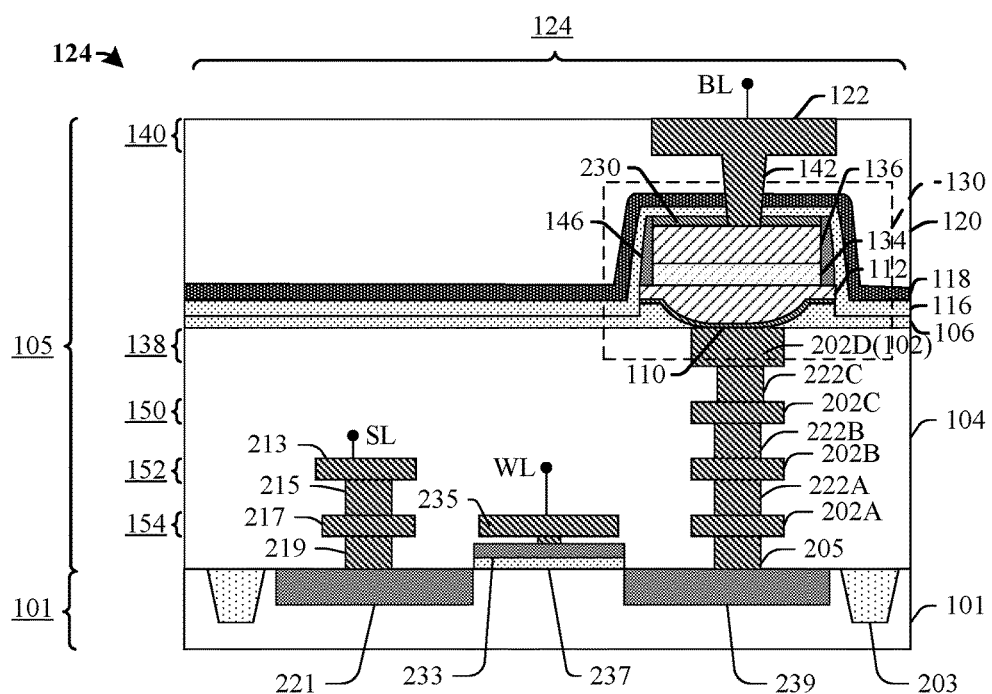
FIG. 2 illustrate a cross-sectional view of some other embodiments of an integrated circuit (IC) having a memory region and an adjacent logic region.

FIG. 2 illustrates a cross-sectional view of the memory region 124 of FIG. 1 including the memory cell 130 according to some embodiments.

As shown in FIG. 2, the interconnect structure 105 can include a plurality of metal layers or other conductive layers (e.g., 140, 138, 150, 152, 154) stacked over one another and disposed over the substrate 101. Metal lines in the metal layers can be isolated from one another by interlayer dielectric (ILD) material 104, such as silicon dioxide or a low-K dielectric. For purposes of clarity, logic region 126 is not shown in FIG. 2, but it will be appreciated that interconnect structure 105 and substrate 101 also extend under the logic region 126 of FIG. 1 in a similar manner.

Still referring to FIG. 2, the memory region 124 of the substrate 101 has a transistor arranged between isolation regions 203. The transistor includes a source region 221, a drain region 239, a gate electrode 233, and a gate dielectric 237. A source line 213 (SL) is connected to the source region 221 through a contact plug 219, a first metal interconnect line 217, and a first metal via 215, which are disposed within one or more ILD layers 104. A word line (WL) 235 for addressing the memory cell 130 is coupled to the gate electrode 233. The bottom electrode 112 of the memory cell 130 is connected to the drain region 239 through contact plug 205, first, second, third, and forth metal interconnect layers 202A-202D, and metal vias 222A-222C. In this example, the second lower metal line 202D (e.g., 102 FIG. 1) is located in the fourth metal interconnect layer, and the upper first upper metal line 122 is located in a fifth metal interconnect layer. However, locations of the lower metal lines 102, 103 and upper metal lines 122, 128 are amenable to any lower or upper metal interconnect layers. In some embodiments, the TEVA 142 connects the top electrode 136 of the memory cell 130 to a bit line 122 arranged within the fifth metal interconnect layer disposed within the upper ILD layer 120. In some embodiments, the memory cell 130 is a magnetoresistive random access memory (MRAM) cell and the resistance switching element 134 can comprise a magnetic tunnel junction (MTJ) structure having a bottom ferromagnetic layer and a top ferromagnetic layer separated by a tunnel barrier layer as shown in FIG. 1. In some other embodiments, the memory cell 130 is a resistive random access memory (RRAM) cell and the resistance switching element 134 can comprise a RRAM dielectric layer as shown in FIG. 2. The RRAM cell can further comprise a hard mask 230 disposed on the top electrode 136 surrounding the TEVA 142 and a spacer 146 along sidewalls of the resistance switching element 134 and the top electrode 136.

Figure 3:
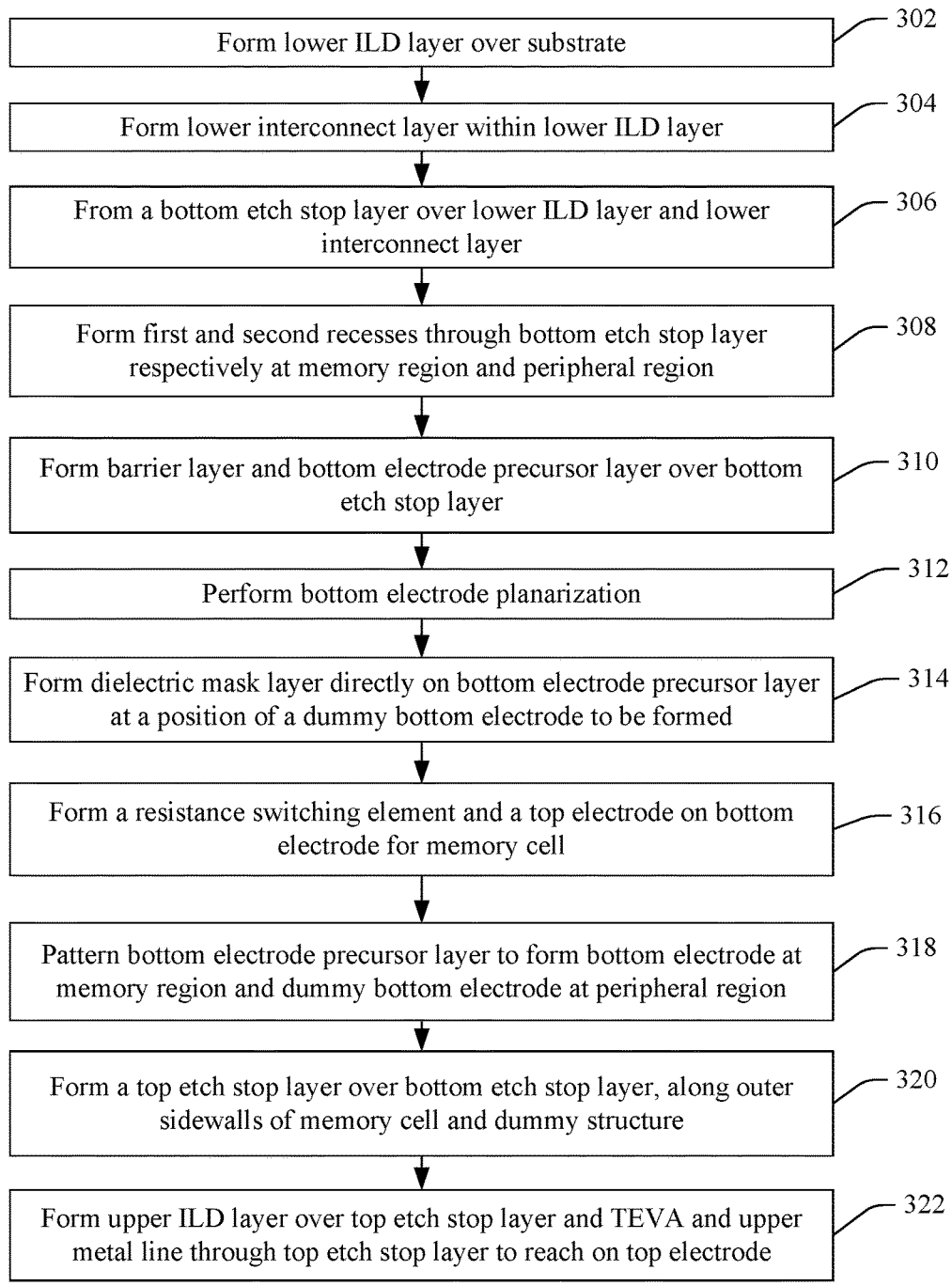
FIG. 3 illustrates a flow diagram of some embodiments of a method of manufacturing an integrated circuit (IC).

FIG. 3 illustrates a flow diagram of a method 300 of manufacturing an integrated circuit (IC) according to some embodiments.

While disclosed method 300 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 302, a lower ILD layer is formed over a substrate.

At act 304, a lower interconnect layer is formed within the lower ILD layer.

At act 306, a bottom etch stop layer is formed over the lower ILD layer and the lower interconnect layer.

At act 308, first and second recesses are formed through the bottom etch stop layer respectively at a memory region and a peripheral region.

At act 310, a barrier layer and a bottom electrode precursor layer are formed in succession over bottom etch stop layer.

At act 312, a bottom electrode planarization is performed.

At act 314, a dielectric mask is formed directly on the bottom electrode precursor layer at a position of a dummy bottom electrode to be formed.

At act 316, a resistance switching element and a top electrode are formed on the bottom electrode for a memory cell.

At act 318, the bottom electrode precursor is patterned to form a bottom electrode for the memory cell at the memory region for the memory cell and a dummy bottom electrode for a dummy structure is formed at the peripheral region.

At act 320, a top etch stop layer is formed over the bottom etch stop layer, along outer sidewalls of the memory cell and dummy structure.

At act 322, an upper ILD layer is formed over the top etch stop layer and a top electrode via and an upper metal line are formed through top etch stop layer to reach on the top electrode.

FIGS. 4-12 illustrate some embodiments of cross-sectional views showing a method of forming an integrated circuit device. Although FIGS. 4-12 are described in relation to method 300, it will be appreciated that the structures disclosed in FIGS. 4-12 are not limited to such a method, but instead may stand alone as structures independent of the method.

Figure 4:
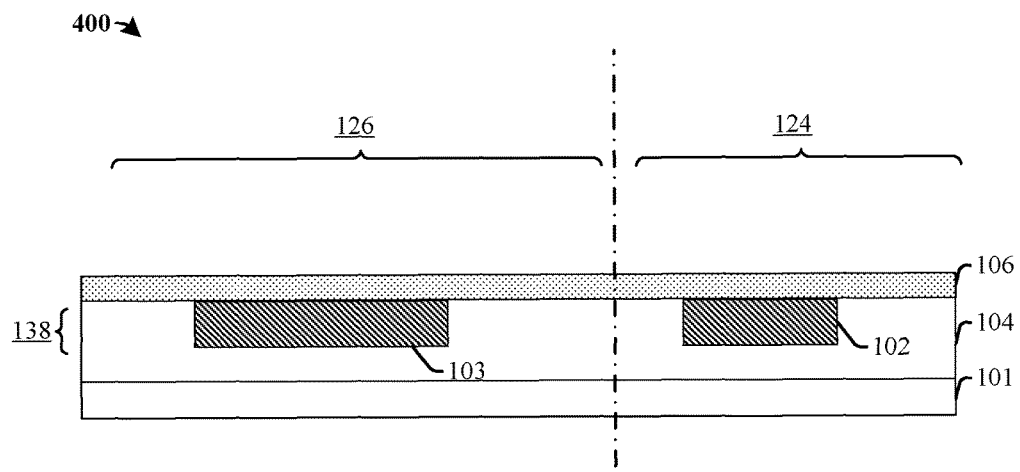
FIGS. 4-12 illustrate cross-sectional views of some embodiments showing a method of manufacturing an integrated circuit (IC).

FIG. 4 illustrates some embodiments of a cross-sectional view 400 corresponding to acts 302, 304 and 306.

As shown in cross-sectional view 400, corresponding to act 302, a lower ILD layer 104 is formed over a substrate 101. Corresponding to act 304, a lower interconnect layer 138 is formed within the lower ILD layer 104. The lower interconnect layer 138 is formed to have a second lower metal line 103 at a logic region 126 and a first lower metal line 102 at a memory region 124. In some embodiments, the lower interconnect layer 138 may be disposed within a back-end-of-the-line (BEOL) metal interconnect stack. The lower metal interconnect layer 402 can comprise lower metal vias or lower metal lines. In some embodiments, the lower interconnect layer 138 may be formed by selectively etching the lower ILD layer 104 (e.g., an oxide, a low-k dielectric, or an ultra low-k dielectric) to form an opening in the lower ILD layer 104. A metal (e.g., copper, aluminum, etc.) is then deposited to fill the opening, and a planarization process is performed to remove excess metal to form the lower interconnect layer 138.

Corresponding to act 306, a bottom etch stop layer 106 is formed over the lower ILD layer 104 and the lower interconnect layer 138. In some embodiments, the bottom etch stop layer 106 may comprise silicon-nitride (SiN), silicon-carbide (SiC), or a similar composite dielectric film. In some embodiments, the bottom etch stop layer 106 may be formed by a vapor deposition technique (e.g., physical vapor deposition, chemical vapor deposition, etc.).

Figure 5:
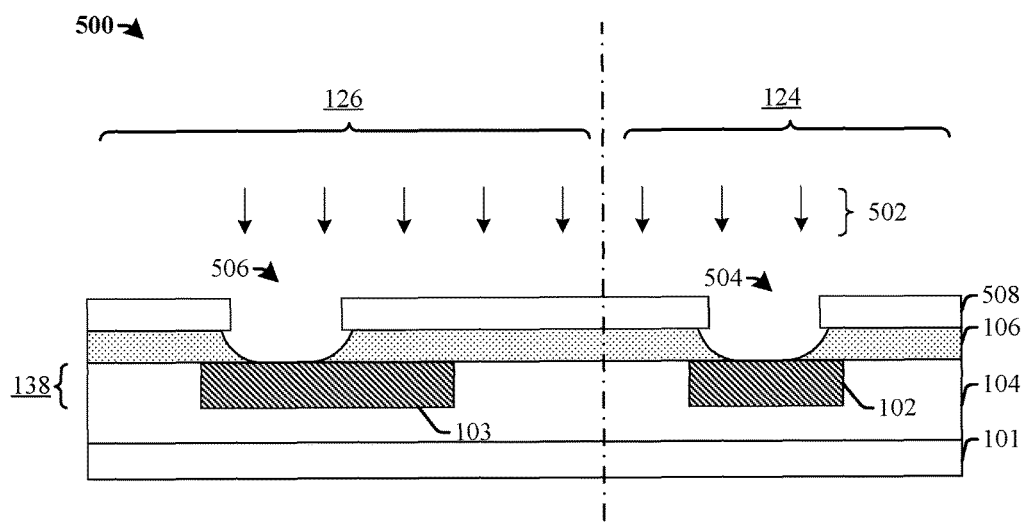

FIG. 5 illustrates some embodiments of a cross-sectional view 500 corresponding to act 308.

As shown in cross-sectional view 500, a mask layer 508 is formed over the bottom etch stop layer 106 to form the first recess 504 and the second recess 506. In some embodiments, the mask layer 508 can be a nitrogen free anti-reflection layer overlying the bottom etch stop layer. The mask layer 508 can be a photoresist layer having openings corresponding to the first and second recesses 504, 506 to be formed. An etchant 502 is used to remove an exposed portion of the bottom etch stop layer 106 not covered by the mask layer 508. In some embodiments, the first and second recesses 504, 506 can be formed through a dry etch process such as a plasma etching. By adjusting powers and flow rate of reactant gases used in the plasma etching, contours of the first and second recesses 504, 506 can be controlled. In some embodiments, a tapered or curved sidewall can be formed to facilitate subsequent reliable filling of the first and second recesses 504, 506 with a conductive material. The first recess 504 is formed through the bottom etch stop layer 106 at the memory region 124 overlying the first lower metal line 102 and a second recess 506 is formed through the bottom etch stop layer 106 at the logic region 126 overlying the second lower metal line 103.

Figure 6:
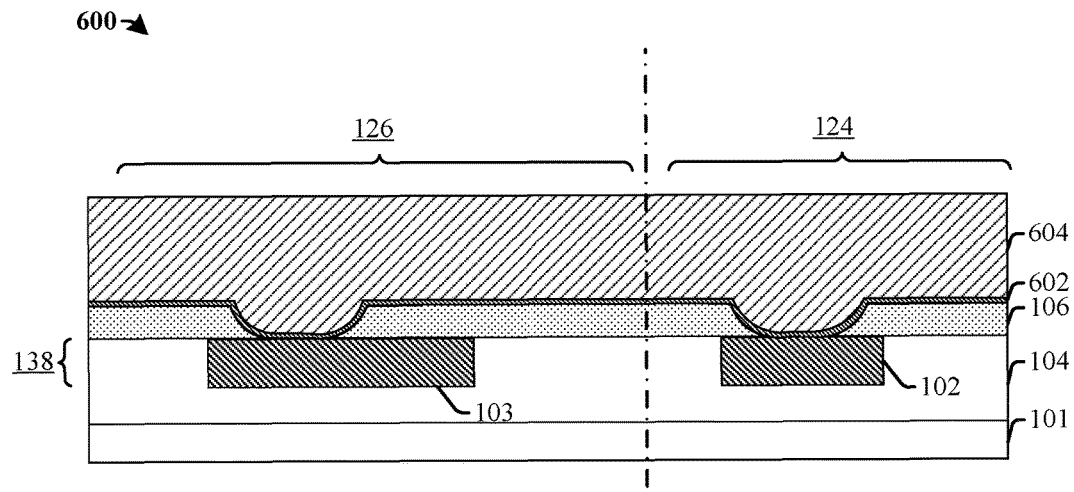

FIG. 6 illustrates some embodiments of a cross-sectional view 600 corresponding to act 310.

As shown in cross-sectional view 600, the mask layer (508 of FIG. 5) is removed and a bottom electrode precursor layer 604 is formed within the first and second recesses 504, 506 and extending over the bottom etch stop layer 106. A diffusion barrier layer 602 may be deposited on the lower interconnect layer 138 (e.g. the second lower metal line 103 and the first lower metal line 102) and along the sidewall of the first and second recesses 504, 506 prior to deposition of the bottom electrode precursor layer 604 to prevent diffusion between the lower interconnect layer 138 and the bottom electrode precursor layer 604. In various embodiments, the bottom electrode precursor layer 604 may comprise a metal nitride (e.g., titanium nitride (TiN) or tantalum nitride (TaN) or a metal (e.g., titanium (Ti) or tantalum (Ta)).

Figure 7:
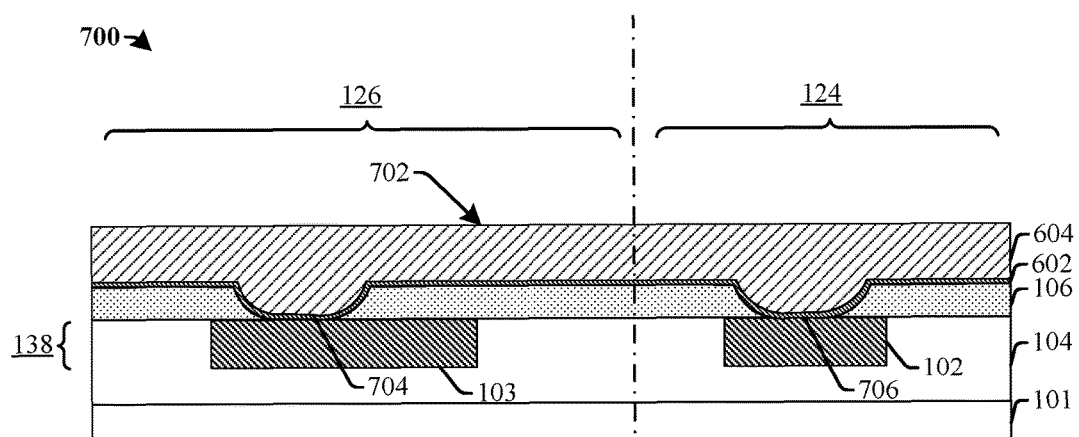

FIG. 7 illustrates some embodiments of a cross-sectional view 700 corresponding to act 312.

As shown in cross-sectional view 700, the bottom electrode precursor layer 604 is lowered by a planarization process such as chemical-mechanical polishing to form a planar upper surface 702. Since a dummy via 704 is formed overlying the second lower metal line 103 at the logic region 126 similar to a bottom electrode via 706 overlying the first lower metal line 102 at the memory region 124, dishing effect to the second lower metal line 103 is minimized and a thickness of the bottom electrode precursor layer 604 becomes uniform after planarization.

Figure 8:
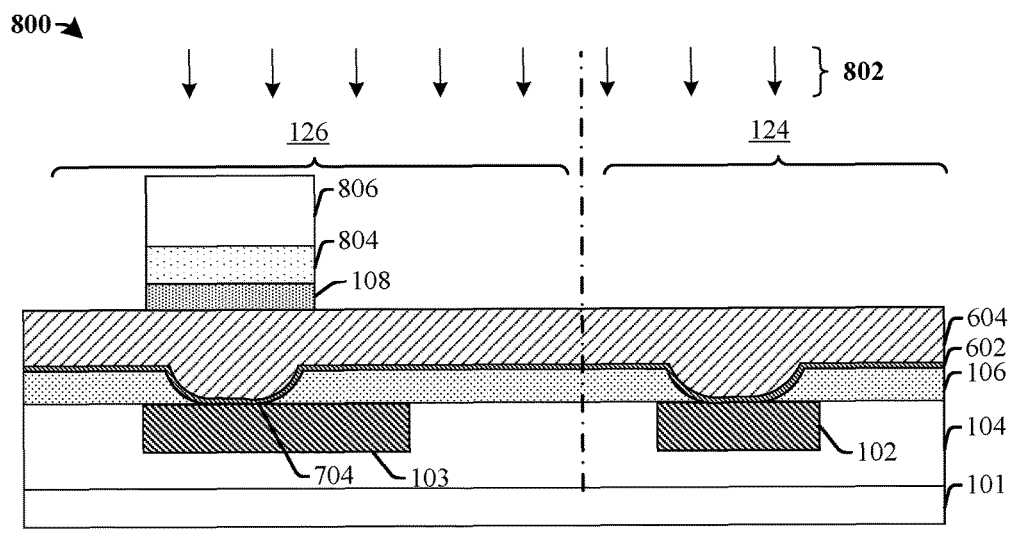

FIG. 8 illustrates some embodiments of a cross-sectional view 800 corresponding to act 314.

As shown in cross-sectional view 800, a dielectric mask 108 is formed directly on the bottom electrode precursor layer 604 overlying a dummy via 704 at a position of a dummy bottom electrode to be formed. In some embodiments, a mask material is formed over the bottom electrode precursor layer 604. Then the mask material is patterned by a photoresist layer 806. An anti-reflective layer 804 can be formed between the photoresist layer 806 and the mask material. In some embodiments, the dielectric mask 108 may be formed by a vapor deposition technique (e.g., physical vapor deposition, chemical vapor deposition, etc.). In some embodiments, the dielectric mask 108 may comprise silicon-nitride (SiN), silicon-carbide (SiC), or a similar composite dielectric film.

Figure 9:
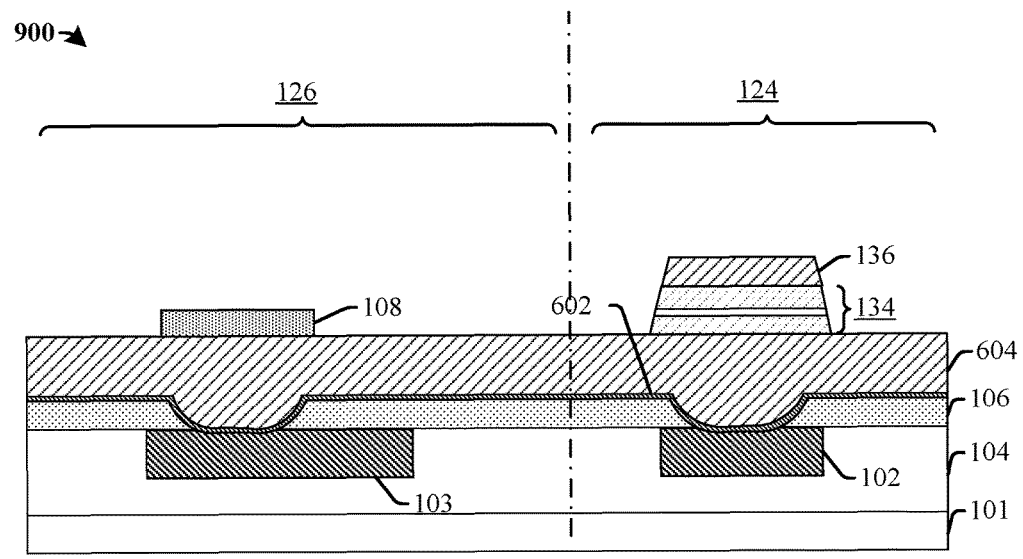

FIG. 9 illustrates some embodiments of a cross-sectional view 900 corresponding to act 316.

As shown in cross-sectional view 900, a resistance switching element 134 and a top electrode 136 are formed in succession over the bottom electrode precursor layer 604. In some embodiments, a hard mask layer and/or a photoresist layer (not shown) may be subsequently formed on the top electrode 136 to facilitate the patterning of the memory cell. In some embodiments, the resistance switching element 134 may comprise a RRAM dielectric layer such as metal oxide composite such as hafnium oxide ($HfO_x$), zirconium oxide ($ZrO_x$), aluminum oxide ($AlO_x$), nickel oxide ($NiO_x$), tantalum oxide ($TaO_x$), or titanium oxide ($TiO_x$) as in its relative high resistance state and a metal such as titanium (Ti), hafnium (Hf), platinum (Pt), ruthenium (Ru), and/or aluminum (Al) as in its relative low resistance state. In some embodiments, the resistance switching element 134 may comprise a magnetic tunnel junction (MTJ) structure having a bottom ferromagnetic layer and a top ferromagnetic layer separated by a tunnel barrier layer.

Figure 10:
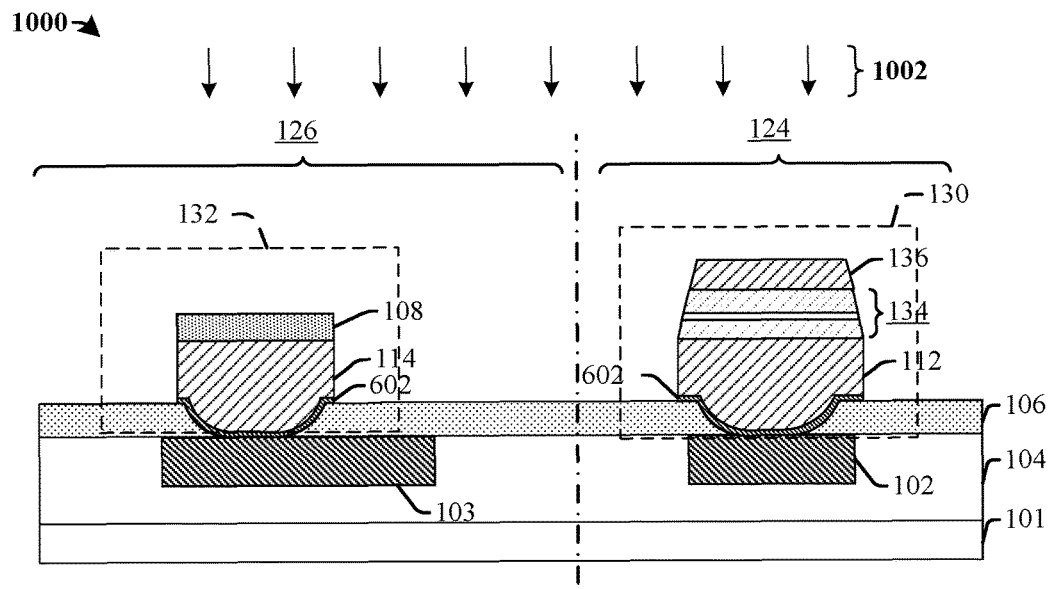

FIG. 10 illustrates some embodiments of a cross-sectional view 1000 corresponding to act 318.

As shown in cross-sectional view 1000, the bottom electrode precursor 604 is patterned to form a bottom electrode 112 for a memory cell 130 at the memory region 124 and a dummy bottom electrode 114 for a dummy structure 132 at the logic region 126. The bottom electrode precursor layer 604 can be patterned according to the dielectric mask 108 and additional mask layer overlying the top electrode 136 (not shown). In some embodiments, the dummy bottom electrode 114 and the bottom electrode 112 may be patterned by a dry etching process 1002. In some embodiments, the dry etching process 1002 may comprise an etchant chemistry having gases including $CF_4$, $CH_2F_2$, $Cl_2$, $BCl_3$ and/or other chemicals.

Figure 11:
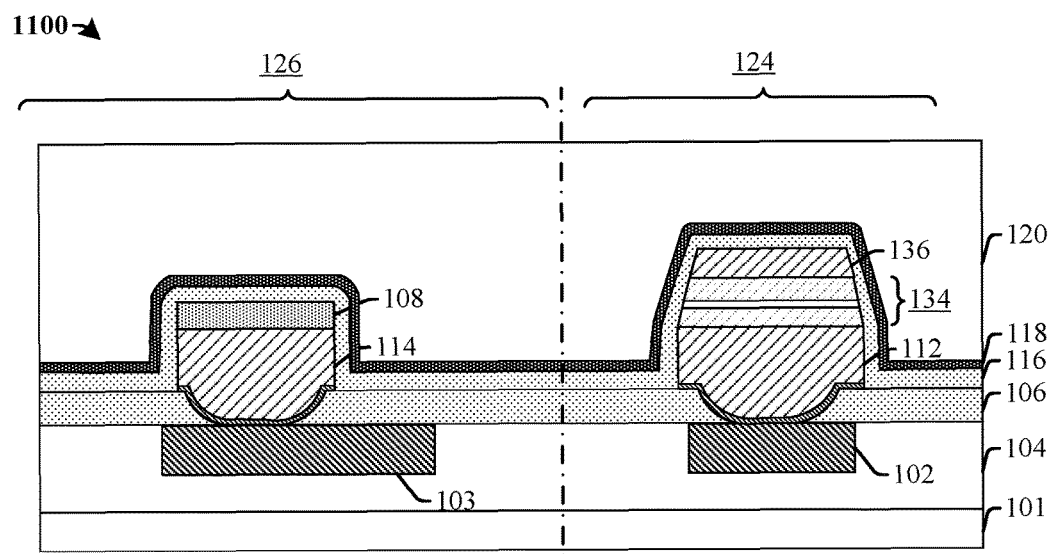

FIG. 11 illustrates some embodiments of a cross-sectional view 1100 corresponding to act 320.

As shown in cross-sectional view 1000, a top etch stop layer 116 is formed over the bottom etch stop layer 106, along outer sidewalls of the memory cell 130 and dummy structure 132. In some embodiments, the top etch stop layer 116 is a conformal dielectric liner made of same or different materials with the bottom etch stop layer 106. The top etch stop layer 116 may comprise silicon-nitride (SiN), silicon-carbide (SiC), or a similar composite dielectric film. In some embodiments, the top etch stop layer 116 may be formed by a vapor deposition technique (e.g., physical vapor deposition, chemical vapor deposition, etc.). In some embodiments, a protective liner 118 can be formed along an upper surface of the top etch stop layer 116. In some embodiments, the protective liner 118 may comprise silicon nitride, tetraethyl orthosilicate (TEOS), silicon-rich oxide (SRO), or a similar composite dielectric film. In some embodiments, the protective liner 118 may be formed by a vapor deposition technique (e.g., physical vapor deposition, chemical vapor deposition, etc.).

Figure 12:
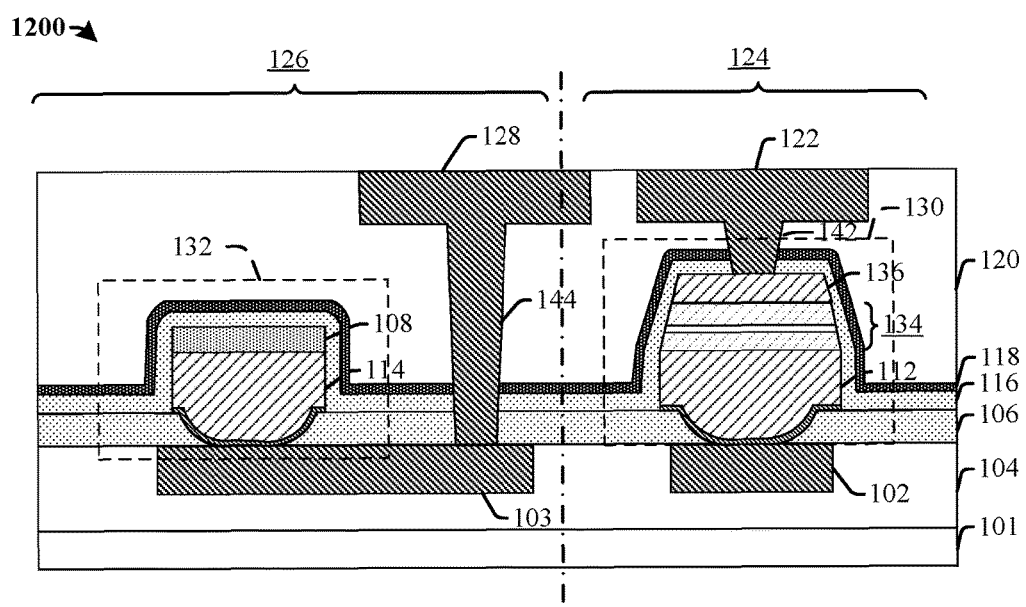

FIG. 12 illustrates some embodiments of a cross-sectional view 1200 corresponding to act 322.

As shown in cross-sectional view 1200, an upper ILD layer 120 is formed over the top etch stop layer 116 and/or the protective liner 118. In some embodiments, the upper ILD layer 120 may comprise an oxide layer, a low-k dielectric layer, or an ultra-low-k dielectric layer formed by a deposition process (e.g., CVD, PECVD, PVD, etc.). A top electrode via 142 and a first upper metal line 122 are formed through the top etch stop layer 116 and/or the protective liner 118 to reach on the top electrode 136. A through via 144 and a second upper metal line 128 are formed through the upper ILD layer 120 to reach on the second lower metal line 103. In some embodiments, the vias and the metal lines may be formed by dual damascene process. Trenches and via holes are formed through the upper ILD layer 120, and then filed with a conductive material (e.g., copper). A planarization is then performed.

It will be appreciated that while reference is made throughout this document to exemplary structures in discussing aspects of methodologies described herein that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes such modifications and alterations and is generally not intended to be limited thereby. For example, although the figures provided herein are illustrated and described to have a particular doping type, it will be appreciated that alternative doping types may be utilized as will be appreciated by one of ordinary skill in the art.

Accordingly, the present disclosure relates to a structure and method for forming an integrated circuit having a dummy structure disposed at a peripheral region of the memory region. The dummy structure comprises a dummy bottom electrode co-planar with a bottom electrode of a memory cell of the memory region. The dummy structure further comprises a dielectric mask disposed on the dummy bottom electrode. The formation of the dummy structure provides a sufficient support and etch stopping when planarizing the bottom electrode of the memory cell and further help provide uniform planarization and eliminate metal line erosion at the logic region.

In some embodiment, the present disclosure relates to an integrated circuit (IC) disposed over a substrate. The IC comprises a plurality of metal layers disposed within an inter-layer dielectric (ILD) material over the substrate. The IC further comprises a memory cell disposed over a first metal layer at a memory region and comprising a bottom electrode directly above a first metal line within the first metal layer and a top electrode separated from the bottom electrode by a resistance switching element. The IC further comprises a dummy structure comprising a dummy bottom electrode arranged directly above a second metal line within the first metal layer at a logic region adjacent to the memory region.

In another embodiment, the present disclosure relates to an integrated circuit (IC). The IC comprises a semiconductor substrate and an interconnect structure disposed over the semiconductor substrate, the interconnect structure including a plurality of metal layers disposed over one another and isolated from one another by interlayer dielectric (ILD) material. The IC further comprises a memory cell including a top electrode and a bottom electrode arranged between a lower metal layer and an upper metal layer of the interconnect structure. The IC further comprises a dummy bottom electrode arranged between the lower and upper metal layers, and having an upper surface that is co-planar with the bottom electrode of the memory cell.

In yet another embodiment, the present disclosure relates to an integrated circuit (IC). The IC comprises a memory region and a logic region adjacent to the memory region. A lower metal layer is disposed within a lower interlayer dielectric (ILD) layer and an upper metal layer disposed within an upper ILD layer overlying the lower metal layer. A memory cell is arranged within the memory region between the lower metal layer and the upper metal layer. The memory cell comprises a top electrode and a bottom electrode separated by a resistance switching element. The bottom electrode is electrically coupled to the lower metal layer and the top electrode is electrically coupled to the upper metal layer. A dummy structure is arranged within the logic region and having a lower surface aligned with a lower surface of the memory cell. The dummy structure comprises a dummy bottom electrode and a dummy dielectric mask disposed on the dummy bottom electrode The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) disposed over a substrate, comprising:
   a plurality of metal layers disposed within an inter-layer dielectric (ILD) material over the substrate;
   a memory cell disposed over a first metal layer at a memory region and comprising a bottom electrode directly above a first metal line within the first metal layer and a top electrode separated from the bottom electrode by a resistance switching element; and
   a dummy structure comprising a dummy bottom electrode arranged directly above a second metal line within the first metal layer at a logic region adjacent to the memory region.

2. The IC of claim 1, wherein the dummy bottom electrode and the bottom electrode are made of the same material as one another.

3. The IC of claim 1, wherein an upper surface of the dummy bottom electrode is co-planar with an upper surface of the bottom electrode.

4. The IC of claim 1, further comprising:
   a barrier layer disposed between the dummy bottom electrode and the second metal line.

5. The IC of claim 1, further comprising:
   a bottom etch stop layer surrounding the bottom electrode and the dummy bottom electrode; and
   a top etch stop layer disposed on the bottom etch stop layer and extending upwardly along sidewalls of the dummy structure and overlying an upper surface of the dummy structure.

6. The IC of claim 5, further comprising a dielectric mask disposed on the dummy bottom electrode and covered by the top etch stop layer.

7. The IC of claim 5, further comprising a TEOS (Tetraethyl Orthosilicate) liner conformally disposed over the top etch stop layer.

8. The IC of claim 1, wherein the memory region comprises a plurality of resistive random access memory (RRAM) cells respectively comprising a bottom electrode and a top electrode separated by a RRAM dielectric layer.

9. The IC of claim 1, wherein first metal line is laterally aligned with the second metal line.

10. The IC of claim 1, wherein the dummy structure has a width in a range of from about 200 Å to about 300 Å.

11. An integrated circuit (IC), comprising:
    a semiconductor substrate;
    an interconnect structure disposed over the semiconductor substrate, the interconnect structure including a plurality of metal layers disposed over one another and isolated from one another by interlayer dielectric (ILD) material;
    a memory cell including a top electrode and a bottom electrode arranged between a lower metal layer and an upper metal layer of the interconnect structure; and
    a dummy bottom electrode arranged between the lower and upper metal layers, and having an upper surface that is co-planar with the bottom electrode of the memory cell.

12. The IC of claim 11, further comprising:
    a dielectric mask disposed over the dummy bottom electrode and having dummy mask sidewalls aligned to sidewalls of the dummy bottom electrode; and
    a silicon carbide layer extending upwardly along sidewalls of the dummy bottom electrode, along sidewalls of the dielectric mask, and overlying an upper surface of the dielectric mask.

13. The IC of claim 12, where the silicon carbide layer extends upwardly along sidewalls of the bottom electrode, along sidewalls of the top electrode, and overlies an upper surface of the top electrode.

14. The IC of claim 11, wherein the dummy bottom electrode and bottom electrode comprise titanium nitride (TiN) having a thickness of about 130 Å, and further comprising a barrier layer disposed between the dummy bottom electrode and an underlying metal line comprising tantalum nitride (TaN) with a thickness of about 10 Å.

15. The IC of claim 11, further comprising a barrier layer disposed between the dummy bottom electrode and an underlying metal line and comprising tantalum (Ta) with a thickness of about 70 Å.

16. An integrated circuit (IC), comprising:
   a memory region and a logic region adjacent to the memory region;
   a lower metal layer disposed within a lower interlayer dielectric (ILD) layer and an upper metal layer disposed within an upper ILD layer overlying the lower metal layer;
   a memory cell arranged within the memory region between the lower metal layer and the upper metal layer, the memory cell comprising a top electrode and a bottom electrode separated by a resistance switching element, wherein the bottom electrode is electrically coupled to the lower metal layer and the top electrode is electrically coupled to the upper metal layer; and
   a dummy structure arranged within the logic region and having a lower surface aligned with a lower surface of the memory cell, the dummy structure comprising a dummy bottom electrode and a dummy dielectric mask disposed on the dummy bottom electrode.

17. The IC of claim 16, wherein the dummy dielectric mask has a sidewall aligned with a sidewall of the dummy bottom electrode.

18. The IC of claim 16, further comprising:
   a top etch stop layer disposed over the lower ILD layer, extending upwardly along sidewalls of the memory cell and the dummy structure, and overlying surfaces of the memory cell and the dummy structure.

19. The IC of claim 18, wherein the top etch stop layer contacts and covers a top surface of the dummy dielectric mask.

20. The IC of claim 16, wherein the dummy bottom electrode is coupled to a lower metal line of the lower metal layer, wherein the lower metal line is connected to an upper metal line of the upper metal layer through a conductive via.

* * * * *